United States Patent [19]

Goyal

[11] 3,942,163

[45] Mar. 2, 1976

[54] CCD STACK MEMORY ORGANIZATION

[75] Inventor: Deepak K. Goyal, Princeton, N.J.

[73] Assignee: Burroughs Corporation, Detroit, Mich.

[22] Filed: June 21, 1974

[21] Appl. No.: 481,728

[52] U.S. Cl. ........................... 340/173 R; 340/172.5
[51] Int. Cl.² .......................................... G11C 13/00
[58] Field of Search ....... 340/172.5, 173 R, 173 RC

[56] References Cited
UNITED STATES PATENTS

| | | | |
|---|---|---|---|
| 3,763,480 | 10/1973 | Weimer............................ | 340/173 R |
| 3,772,658 | 11/1973 | Sarlo ............................... | 340/173 R |

*Primary Examiner*—Terrell W. Fears
*Attorney, Agent, or Firm*—Franklin D. Ubell; William B. Penn; Kevin R. Peterson

[57] ABSTRACT

A stack memory having a last-in-first-out memory organization comprising a plurality of pairs of two-phase charge coupled device shift registers arranged into a plurality of rows, the CCD registers of each pair being interconnected by digital logic to provide a circular shift register cell and to direct data into and out of the cell. Each cell is interconnected through its logic to an adjacent cell within the same row, and each row of a plurality of circular shift register cells is interconnected between an input buffer register and an output buffer register. The input buffer register is used to write data into each one of the plurality of rows of cells, and the output buffer register is used to retrieve the data from each row of cells. A system control is included for controlling the read, write, and idle operations, wherein a CCD circular shift register cell provides a control loop for maintaining synchronization over the memory system, and wherein there is also provided a clock generator and switch means for generating clock signals.

10 Claims, 4 Drawing Figures

CCD STACK MEMORY ORGANIZATION

BACKGROUND OF THE INVENTION

This invention relates generally to stack memory systems, and more specifically to a charge coupled device (CCD) stack memory organization for providing a last-in-first-out (LIFO) memory.

Charge coupled devices are well-known in the prior art. CCD's have found use in slow scan TV cameras, document reading, and other high sensitivity imaging applications. CCD's have also been used in memory systems, and for shift register applications. The CCD concept is a relatively new concept, yet as illustrated its application has spread into a number of areas.

Very basically, CCD's are fabricated as MOS or MIS integrated circuits, wherein potential wells are formed by the application of voltage pulses to the substrate, to activate MOS or MIS capacitors. Voltage charges may be inputted and shifted along various points throughout the substrate through the proper application of voltage pulses to the MIS/MOS capacitors. Refresh circuitry is required to maintain the magnitude of the voltage charges which would otherwise dissipate. Fabrication of the substrates and the means for moving the charge around the substrate are well illustrated in the following articles and patents.

Kosonocky U.S. Pat. Nos. 3,760,202 and 3,758,794 disclose the use of charge coupled devices as shift register stages. Also disclosed are signal regeneration circuits, methods and means for operating CCD's in plural phase configurations, and clocking and timing means. The above Kosonocky patents disclose CCD shift registers interconnected into rings in such a manner to provide an elongated shift register having a first-in-first-out data storage capability.

The application and technology of charge coupled devices have been discussed in a number of papers, including W.S. Boyle and G.E. Smith, "Charge-coupled Devices — A New Approach To MIS Device Structures," *IEEE Spectrum*, July 1971; Altman, "The New Concept For Memory and Imaging: Charge Coupling," *Electronics*, June 21, 1971; J.E. Carnes and W.F. Kosonocky, "Charge-Coupled Devices and Applications," *Corporate Engineering Services*, RE-18-5-22, August 1972, page 78. These articles describe the physical configuration of CCD shift registers, and the required control and refresh circuitry necessary to operate the CCD registers.

It has been proposed in the prior art to use bidirectionally shifting CCD shift registers for use in memory stacks to obtain a LIFO memory operation. Bidirectional CCD shift registers are only obtainable from CCD integrated circuit chips fabricated for three or four phase timing or clock operation. A major disadvantage of three or four phase integrated circuit CCD shift registers is that the on-chip complexity is increased and the bit density per chip is decreased in comparison to two phase integrated circuit CCD shift registers. It has not proven possible to use the simpler two phase integrated circuit CCD shift registers in a bidirectional format to obtain the LIFO operation.

SUMMARY OF THE INVENTION

Accordingly, with these prior art problems in mind, it is an object of this invention to improve CCD stack memories having a last-in-first-out (LIFO) capability.

Another object of this invention is to provide an improved stack memory utilizing two phase CCD integrated circuits chips.

A further object of this invention is to provide an improved stack memory with digital logic for interconnecting a pair of charge coupled device shift registers into a circular shift register configuration.

A still further object is to provide an improved stack memory with a plurality of CCD circular shift register cells arranged or interconnected to provide a LIFO computer memory system.

Yet another object is to provide an improved CCD stack memory with control logic to provide a LIFO memory function.

An additional object of the invention is to provide a CCD stack memory with improved average access time over prior art single closed loop CCD shift register memories.

These and other objects and advantages are accomplished in a stack memory including integrated circuits each having a pair of CCD shift registers and logic for interconnecting the shift registers into a circular configuration. A plurality of the CCD circular shift registers are interconnected into a plurality of rows between an input buffer and an output buffer. A CCD circular shift register cell is included with control logic to maintain system synchronization, and deliver clock signals from a clock generator to the CCD cells.

BRIEF DESCRIPTION OF THE DRAWINGS

The foregoing objects and advantages of the invention, together with other advantages, which may be obtained by its use, will be apparent from the following detailed description of the invention when read in conjunction with the following drawings.

DETAILED DESCRIPTION OF THE INVENTION

Figure 1:
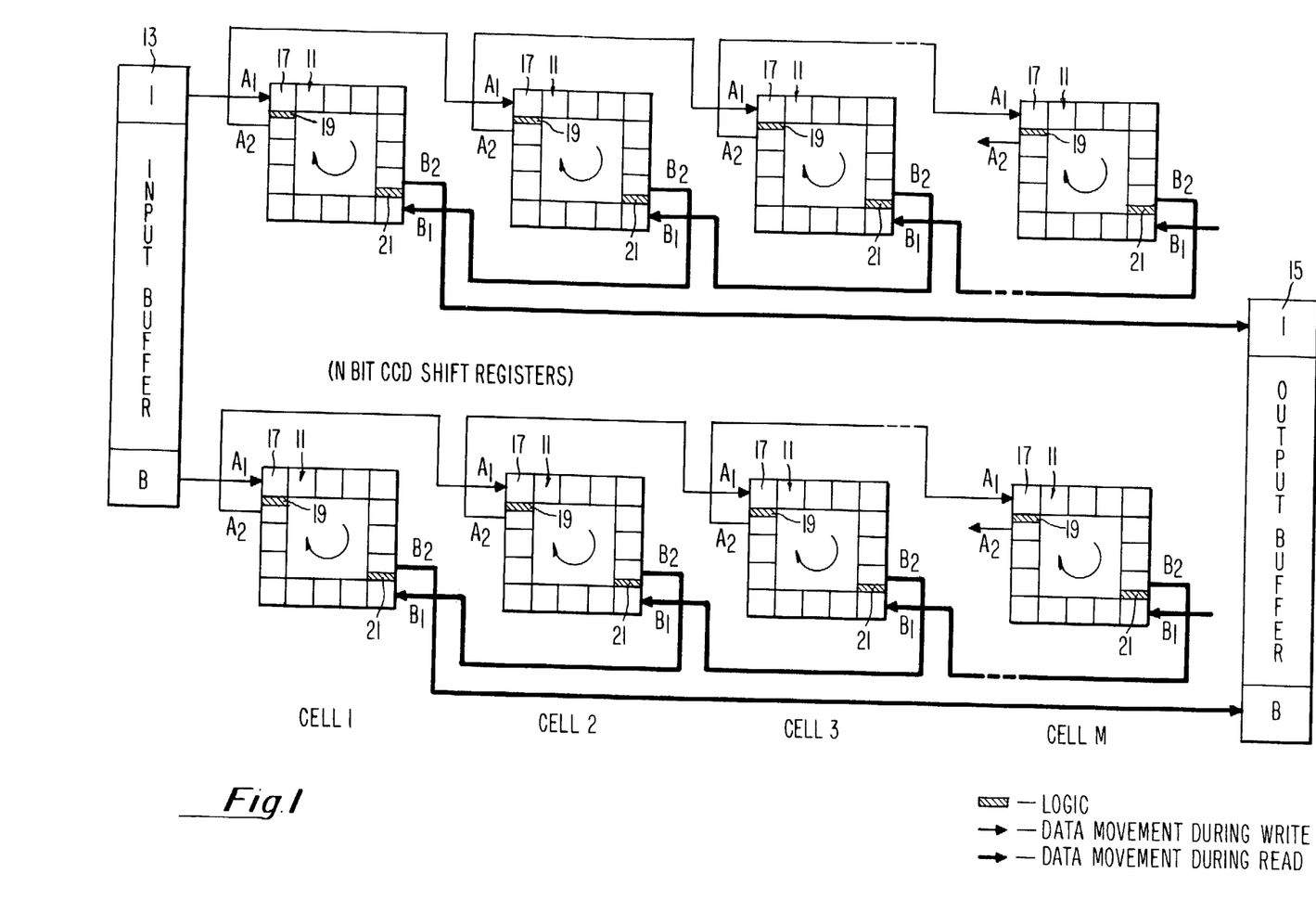
FIG. 1 is a block circuit diagram of the CCD stack memory system organization.

The CCD stack memory system organization of the preferred embodiment of the invention as shown in FIG. 1, includes a plurality of charge coupled device (CCD) circular shift registers or cells 11 arranged into a plurality of rows, adjacent cells 11 of each row being interconnected, and each row being interconnected between an input buffer 13 and an output buffer 15.

The input buffer register 13 has output lines equal in number to one through B, each line being connected to a data feed input $A_1$ of the leftmost cell of a corresponding row of cells 11 associated with that line. Proceeding down any individual row of cells 11 from left to right, each cell 11 has a data feed output $A_2$ connected to the $A_1$ input of the adjacent cell 11 to the right; a data return input $B_1$ of each cell 11 is connected to a data return output $B_2$ of adjacent cells 11 to the right; the exception to this interconnection scheme being that the leftmost cells 11 have their $B_2$ outputs interconnected to the output buffer register 15, and the rightmost cells 11 of any given row have their $A_2$ outputs floating.

Thus, the proposed organization of the preferred embodiment of the invention consists of M CCD cells 11, each comprising an N bit closed loop shift register. Because data input/output occurs at the leftmost cell in each row, the average access time for reading or writing data is N/2. If only one long closed loop CCD shift register having M×N bits were used, the average access time would be (M×N)/2. Thus, the organization of the preferred embodiment gives an access time improved by a factor of M over single loop memory organizations.

During a write operation, the $B_1$ inputs and $B_2$ outputs of each CCD circular shift register cell 11 are disabled, permitting data bits entered into the $A_1$ input of each of the cells 11 to circulate clockwise through every bit position of the cell, and be outputted from the $A_2$ output of the cells 11. Data is outputted from the input buffer 13 to the $A_1$ inputs of the leftmost cells 11 of each row of interconnected cells 11. For a given row of the interconnected circular shift register cells 11, data is entered serially into the $A_1$ input of the leftmost cell 11 of that row. As successive data bits are entered into the leftmost cell 11, preceding bits are shifted clockwise through all bit positions of that cell 11 and outputted from its $A_2$ output into the $A_1$ input of the adjacent cell 11 to the right, where the data bits are again shifted clockwise through each bit position of this second leftmost cell 11, and outputted therefrom to the $A_1$ input of the next adjacent cell 11 to the right. The process is repeated until the data bits to be stored have been written or loaded into an appropriate number of cells 11 providing the required number of data bitspositions of the cells 11 have been filled. If the bit capacity of a given row of interconnected cells 11 is exceeded by the inputted data, the data overflow will spill over or be lost from the $A_2$ output of the rightmost cell 11 of each row. In this manner, data is written into each one of the rows of interconnected cells 11, each row providing bit positions corresponding to like bit positions in every other row for accepting data words or bytes in parallel from the input buffer 13.

During a read operation, data is outputted in parallel from the rows of interconnected cells 11 to the output buffer 15 in a last-in-first-out (LIFO) mode. This is accomplished by disabling the $A_1$ inputs and $A_2$ outputs of each of the cells 11, and enabling the $B_1$ inputs and $B_2$ outputs of the cells 11. For a given row of cells 11, at the initiation of the read operation, the last bit of data received by the leftmost cell 11 from the input buffer 13 is circularly shifted clockwise through that cell 11 and outputted from the $B_2$ output of the cell 11 as the first output bit to the output buffer 15, wherein preceding data bits follow. The data bits contained in the rightmost cells 11 of each row are similarly shifted out of the $B_2$ output of that cell 11 in a LIFO mode, and returned back down the row to the $B_1$ input of the adjacent cell 11 to the left from whence they came. The process is repeated, proceeding from right to left down the row of cells 11 until all data bits have been shifted back down the row of CCD circular shift register cells 11 to the leftmost cells 11, and outputted therefrom to the output buffer 15.

Data is always shifted or circulated in the same direction within each circular cell 11 of the memory, eliminating the need for bidirectional shift registers to obtain the function of a last-in-first-out memory. During those periods of time when reading or writing is not being accomplished, i.e. idle time, the $A_1$, $B_1$ inputs and $A_2$, $B_2$ outputs of each cell 11 are disabled to maintain or refresh data stored within the cells 11, by continuously circulating the data stored in each cell 11 through all bit positions of their respective cells 11.

The logic 19, 21 of each of the cells 11, is included as part of the integrated circuitry of the cells 11. The logic 19, 21 is used, as will be explained below, to selectively enable and disable the $A_1$, $B_1$ inputs and $A_2$, $B_2$ outputs of each of the cells 11, in providing the write, read, and idle modes of operation of the stack memory.

Figure 2:
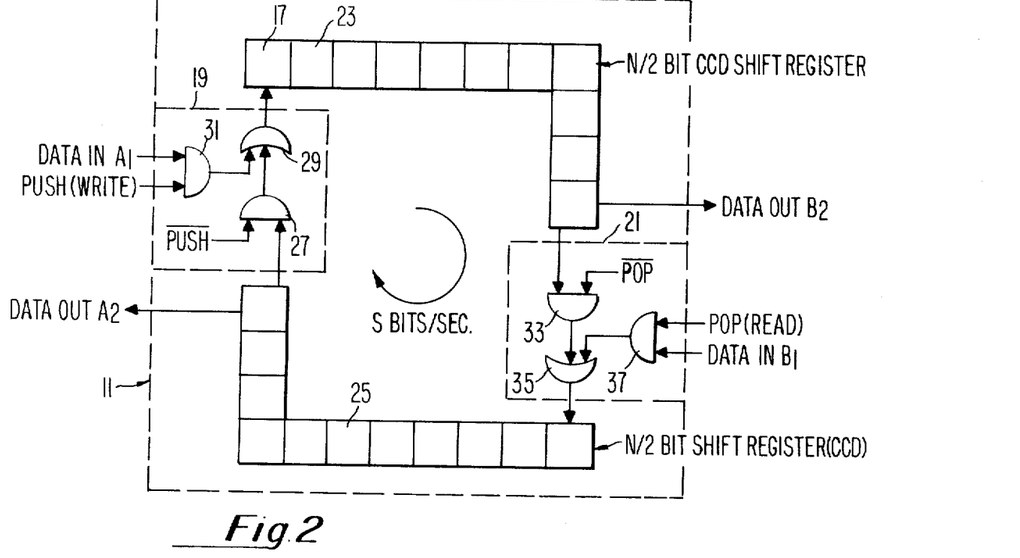
FIG. 2 is a block and logic circuit diagram of a CCD circular shift register or basic cell.

A basic cell or CCD circular shift register 11 is shown in FIG. 2. The basic cell 11 includes an upper and lower N/2 bit CCD serial shift registers 23, 25 interconnected by digital logic 19, 21 to provide an N bit circular shift register or basic cell 11. The logic 19 includes an AND gate 27 having an input connected to an end of the lower CCD shift register 25 and another input connected to a PUSH signal line. The output of the AND gate 27 is interconnected to an input of an OR gate 29. The OR gate 29 has a second input connected to the output of an AND gate 31. The output of the OR gate 29 is connected to an input of the upper CCD shift register 23. The AND gate 31 has one input connected to a data feed input line $A_1$, and another input connected to a PUSH signal line.

The logic 21 interconnects the other ends of the upper and lower CCD shift registers 23, 25, and includes an AND gate 33 having an input connected to an output of the upper shift register 23, a second input connected to a POP signal line, and an output connected to an input of an OR gate 35; a second input of the OR gate 35 is connected to the output of an AND gate 37, the output of the OR gate 35 is connected to an input of the lower shift register 25; one input of the AND gate 37 is connected to a POP signal line, and a second input to a data return input signal line $B_1$. The output of the upper shift register 23 is connected to an input of AND gate 33 and to a data return output line $B_2$. The end of the lower shift register 25 is connected to an input of AND gate 27 and also to a data feed output line $A_2$.

Operation of a basic cell 11 during a write operation is such that at the initiation of the write operation the PUSH signal line goes high, permitting data to be inputted from the $A_1$ data feed input line through AND gate 31 and OR gate 29 into the upper CCD shift register 23. The POP signal line is also high during a write operation, permitting data shifted clockwise through the upper shift register 23 to be passed through AND gate 33 and OR gate 35 into the lower CCD shift register 25. The PUSH signal line is low, inhibiting AND gate 27 and in turn forcing data shifted clockwise through the lower shift register 25 to be outputted into through the $A_2$ data feed output line connected to lower register 25. The POP signal line is also low during the write operation, inhibiting AND gate 37, to prevent data from being inputted from the $B_1$ data return input line to the lower shift register 25.

During a read operation, operation of a basic cell 11 is such that the PUSH signal line goes low inhibiting AND gate 31 preventing data from being passed through to the upper shift register 23, and the PUSH signal line goes high to enable AND gate 27 for passing data from the lower shift register 25 through AND gate 27 and OR gate 29 to the upper shift register 23, while at the same time inhibiting the $A_2$ data feed output line of the lower register 25. The POP signal line goes high to enable AND gate 37 to pass data from the data return input line $B_1$ through AND gate 37 and OR gate 35 to the lower shift register 25. The POP signal line is low to inhibit AND gate 33 and force data to be outputted from the data return output line $B_2$ of the upper shift register 23.

During idle periods, when the stack memory system is not in a read or write mode of operation, data is maintained within each of the basic cells 11 by continuously circulating or shifting the data clockwise through the bit positions of the cells 11. During the idle period, the PUSH and POP signal lines are low, to inhibit AND gates 31 and 37 to prevent data from being inputted into the basic cells through either $A_1$ or $B_1$ data input lines; and PUSH and POP signal lines are high to enable AND gates 27 and 33, respectively, in order to permit data to be continuously circulated or shifted clockwise through all bit positions of the upper and lower shift registers 23, 25. The data circulation is such that data passes from the lower shift register 25 through AND gate 27 and OR gate 29 to the upper shift register 23, and from the upper shift register 23 through AND gate 33 and OR gate 35 to the lower shift register 25.

Figure 3:
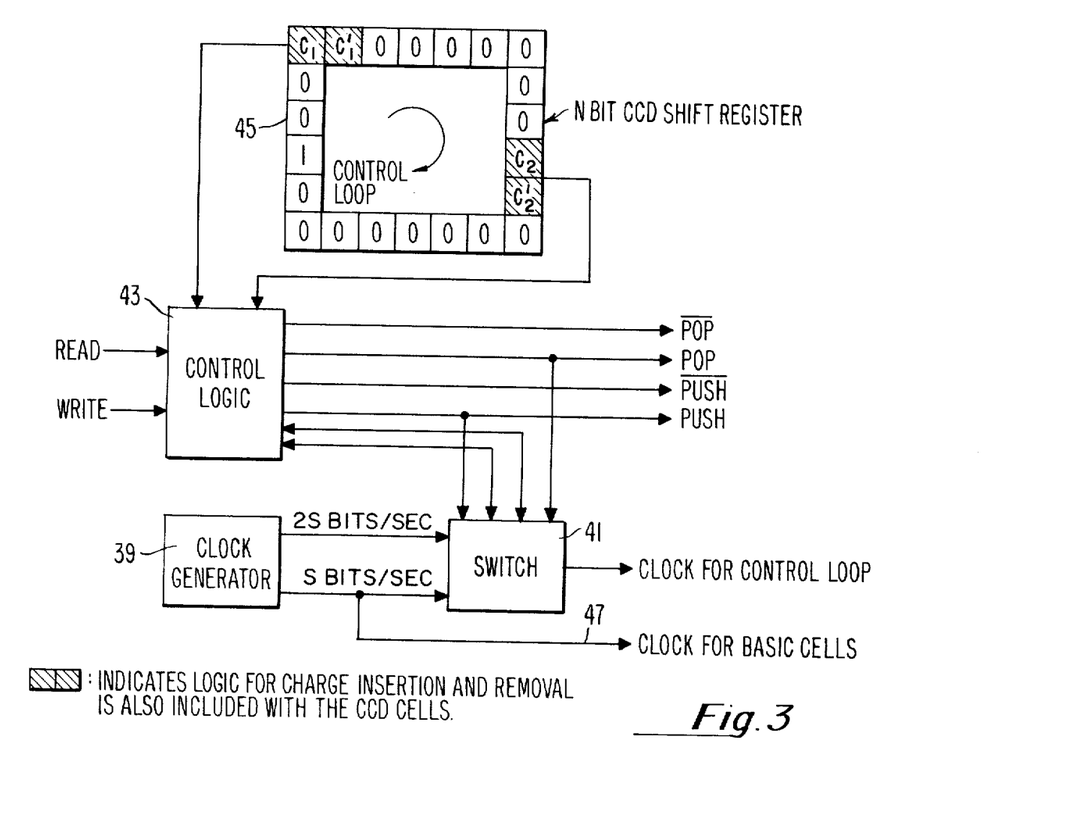
FIG. 3 is a block circuit diagram of the system control.

A block diagram of the system control is shown in FIG. 3. The system control includes a clock generator 39, a switch 41, control logic 43, and a control loop 45.

The control loop 45 is an N bit CCD circular shift register into which a binary "one" is stored in one bit position and binary zero's are stored in all other bit positions. The binary "one" in control loop 45 is continuously circulated around the control loop 45 during idle periods, when no read or write operation is in process. The binary "one" bit of the control loop is in bit position synchronization with the last bit of data entered into the memory system through the input buffer 13. In other words, the last bit of data written into a leftmost cell 11 of any one of the rows of cells 11 occupies, at any given time, the same bit position within the leftmost cell 11 as the binary "one" bit position of the control loop 45, wherein the last data bits entered are circulated synchronously as to bit position with the binary "one" of the control loop 45. In this manner, the system control is able to keep track of the data bit position of the last bit of data entered into the leftmost cells 11 of the rows of registers.

The control logic 43 is interconnected to and controls the switch 41 in providing a clock for the control loop of either s bits per second or 2s bits per second, as will be explained in more detail below. The control logic 43 also provides an individual output line for the POP, POP, PUSH, and PUSH signals, for interconnection to and control of the basic cells or circular shift registers 11 of the memory system.

The system control also provides a clock output line 47 for interconnection to the basic cells or circular shift registers 11 of the system. The clock output line 47 is interconnected to the s bits per second output line of the clock generator 39, to shift the basic cells 11 at a shift rate of s bits per second.

When READ and WRITE signal lines are both low, the control logic 43 provides a low signal on both the POP and PUSH signal lines, and a high signal on the POP and PUSH signal lines. In addition, the control logic 43 functions during an idle condition to control the switch 41 to provide a clock signal to the control loop 45 of s bits per second.

When a READ pulse or high signal is received by the control logic 43 on the READ signal line, the control logic 43 is activated to sense the shifting of the binary "one" of the control loop 45 into the C bit position, at which time the control logic 43 causes the POP signal line to go high and the POP signal line to go low. As substantially the same time that the POP signal line goes high, the last data bit written into each of the leftmost cells 11 will be outputted from their $B_2$ outputs and inputted to the output buffer 15.

When the POP signal goes high, the control logic 43 operates the switch 41 to change the clock signal of the control loop 45 from s bits per second to 2s bits per second for one normal clock period, i.e. 1/s seconds. The double clocking is required in order to advance the binary "one" of the control loop 45 one bit position ahead so that it now corresponds in bit position of the last bit of data entered into and now remaining in the system, for the previous last data bit has been read out of the system. In other words, upon reading out the last data bit entered into the system, the binary "one" bit of the control loop 45 lags one bit position behind the now existing last data bit position of data remaining in the leftmost circular shift registers 11 of the rows of shift registers and must be advanced one bit position ahead in order to again serve as the index point corresponding to the last bit of data entered into the system of the data remaining in the system. After being advanced one bit position, the binary "one" bit of control loop 45 will again be shifted clockwise at s bits per second in synchronization with the last bits of data in each of the leftmost cells 11.

If the READ signal remains high, the control logic 43 will cause the next last data bit written into each of the rows of shift registers 11, to be read out from the leftmost cell 11 of each row upon sensing the shifting of the binary "one" of the control 45 into the $C_2$ bit position of the control loop 45, whereupon the control loop is again shifted at twice the normal clock rate to advance the binary "one" bit one bit position, the new bit position of the binary "one" bit of the control loop 45 representing the now last data bit position of data entered into any of the leftmost cells 11 of the rows of cells 11, as explained previously. The process is repeated until the READ signal line goes low. During the READ operation, the POP signal line is high, and the POP signal line is low only for that period of time that the binary "one" bit of the control loop 45 remains in the $C_2$ bit position of the control loop 45. Thus, for each successive last bit or byte readout of the system, the next successive bit or byte cannot be readout until the binary "one" of the control loop 45 has circulated or shifted through all bit positions of the control loop 45 and has reentered the $C_2$ bit position.

Figure 4:
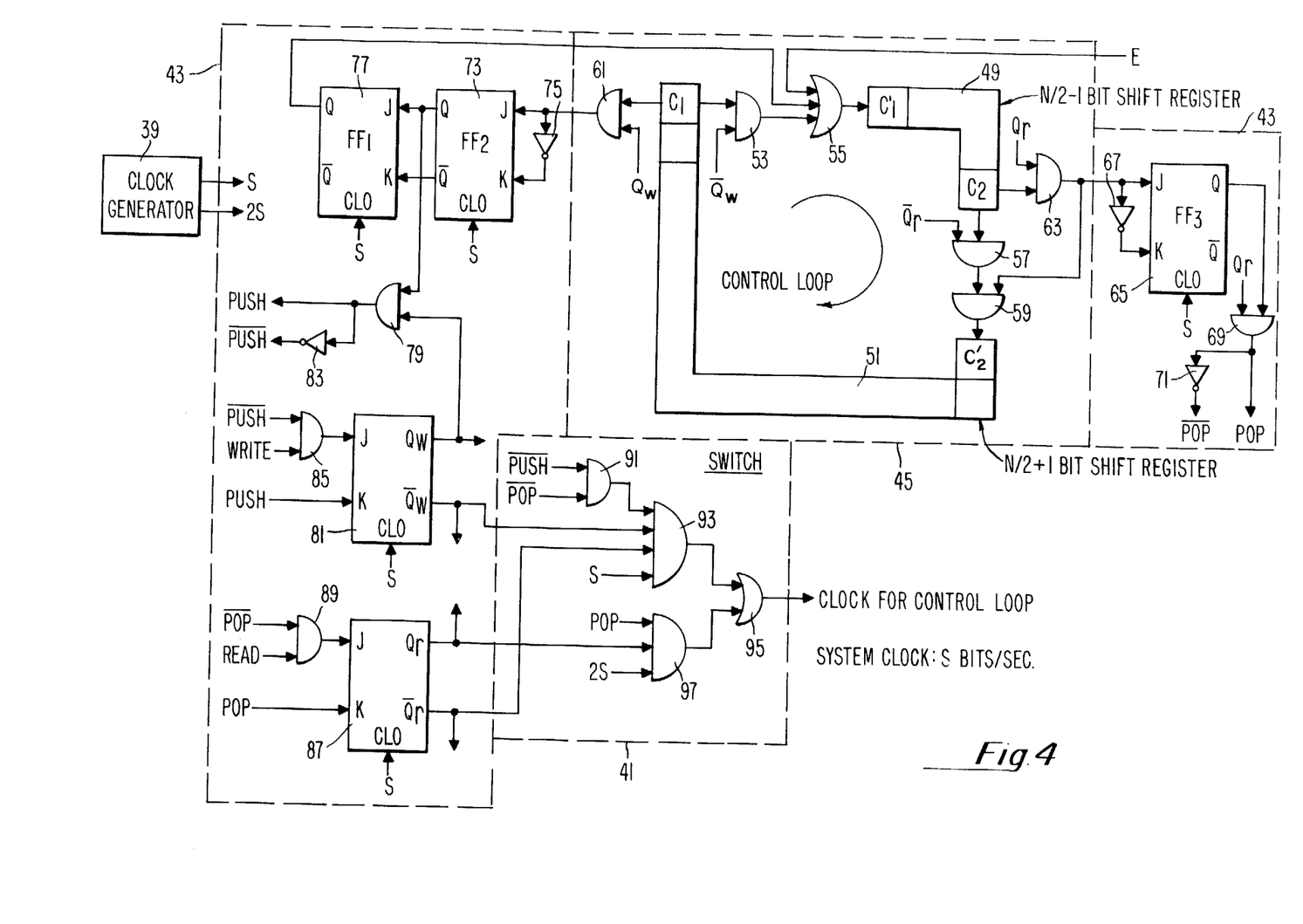
FIG. 4 is a logic circuit schematic of the system control.

When the WRITE signal line goes high, the control logic 43 is activated to sense when the binary "one" bit of the control loop 45 is shifted into the C bit position of the control loop 45, whereupon the control logic 43 operates to cause the PUSH and POP signal lines to go high, and the POP and PUSH signal lines to go low. Also, at substantially the same time, the control logic 43 operates switch 41 to negate or remove the clock signal from the control loop 45, causing the binary "one" bit to remain in the $C_1$ bit position of the control loop 45 for one clock period. During this period of time, bits of a byte of data are written in parallel into the leftmost cells 11 of each of the rows of cells 11. After one clock period of time has passed, the control logic 43 is reset, causing the PUSH signal to go low and the PUSH signal to go high. If the WRITE signal line remains high, another byte of information may be read into the system in a similar manner, when the binary bit of the control loop has shifted through all bit positions of the control loop 45 and returned to the $C_1$ bit position of the control loop 45, whereupon the new WRITE operation may be pursued. Of course, control logic may be provided to hold the binary "one" bit of the control loop 45 in the $C_1$ bit position for a period of time greater than one clock period, in order to WRITE into the system successive bytes of information. The circuitry for the system control shown in FIG. 4, provides for writing data into the system as described above.

The logic circuitry for and the operation of the system control will now be described in greater detail, with reference being made to FIG. 4. It is to be understood that the circuitry shown for the system control is a typical circuit; many other circuits may be designed to provide the system control function. The entire circuit shown in FIG. 4 for the system control can be fabricated on a single integrated circuit chip.

The control loop 45 includes an upper-shift register 49 having $N/2-1$ bits; a lower shift register 51 having $N/2+1$ bits; the $C_1$ end bit position of the lower shift register 51 is interconnected through an AND gate 53 and an OR gate 55 to the end bit position $C_1$ of the upper shift register 49, wherein the $C_1$ bit position of lower shift register 51 is connected to an individual input of the AND gate 53, the output of the AND gate being connected to an individual input of the OR gate 55, and the output of the OR gate 55 connected to $C_1$ end bit position of the upper shift register 49.

The other end bit position $C_2$ of the upper shift register is interconnected through an AND gate 57 and an OR gate 59 to the other end bit position $C_2$ of the lower shift register 51. The $C_1$ end bit position of the lower shift register 51 is also connected to an individual input of an AND gate 61; similarly, the $C_2$ end bit position of the upper shift register 49 is connected to an individual input of an AND gate 63.

The control logic 43 includes a JK flip-flop 65 having its J input terminal connected both to the output of the AND gate 63 of control loop 45, and through an inverter 67 to its K input terminal. The Q output terminal of the flip-flop 65 is connected to an individual input of an AND gate 69, the output of AND gate 69 being connected both to the POP signal line, and through an inverter 71 to the POP signal line.

Other portions of the control logic 43 include a JK flip-flop 73 having its J input terminal connected to the output of AND gate 61 of control loop 45, the J input terminal also being connected through an inverter 75 to the K input terminal of flip-flop 73. The Q output terminal of flip-flop 73 is connected to the J input terminal of a flip-flop 77, and also to an individual input of an AND gate 79, the Q output of flip-flop 73 being connected to the K input terminal of flip-flop 77. The Q output terminal of flip-flop 77 is connected to an individual input of OR gate 55 of control loop 45.

AND gate 79 also has an individual input connected to the Q output terminal of a flip-flop 81; the output of AND gate 79 being connected both to the PUSH signal line and through an inverter 83 to the PUSH signal line.

Flip-flop 81 also has its $Q_w$ output terminal connected to an individual input of AND gate 61 of control loop 45, its $Q_w$ output terminal connected to an individual input of AND gate 53 of control loop 34, its J input terminal connected to an output of an AND gate 85, and its K input terminal connected to the PUSH signal line.

AND gate 85 also has an individual input connected to the PUSH signal line, and another individual input connected to the WRITE signal line. A fifth flip-flop 87 has its J input terminal connected to the output of an AND gate 89, and its K input terminal connected to the POP signal line.

AND gate 89 also has an individual input connected to the POP signal line, and another individual input connected to the READ signal line.

Flip-flop 87 has its $Q_r$ output terminal connected to an individual input of AND gates 63 and 69 of control loop 45, and its $Q_r$ output terminal connected to an individual input of AND gate 57 of control loop 45.

The switch 41 includes an AND gate 91 having one individual input connected to the PUSH signal line, a second individual input connected to the POP signal line, and an output connected to an individual input of an AND gate 93. The output of the AND gate 93 is connected to an input of an OR gate 95, OR gate 95 also having another individual input connected to an output of an AND gate 97. The output of OR gate 95 provides the clock signal line for the control loop 45. AND gate 93 has an individual input connected to the $Q_w$ output terminal of flip-flop 81 of control logic 43, another input connected to the $Q_r$ output terminal of flip-flop 87 of control logic 43, and yet another individual input connected to the s bits per second output line of the clock generator 39. AND gate 97 has one individual input connected to the POP signal line, a second individual input connected to the $Q_r$ output terminal flip-flop 87 of control logic 43, and a third individual input connected to the 2s bits per second clock output line of clock generator 39.

Operation of the system control logic circuitry follows. During idle operation times of the stack memory system, when neither a READ or WRITE operation are being performed, both READ and WRITE signal lines are low, causing flip-flops 81 and 87 to be in a reset mode of operation. As a result, AND gates 79 and 69 are inhibited, causing the PUSH and POP signal lines to be low. Also, AND gate 61 is inhibited, and AND gate 53 is enabled to permit data to flow in the control loop 45 from the $C_1$ digit position of the lower shift register 51 through to the $C'_1$ bit position of the upper shift register 49. Similarly, AND gate 63 is inhibited, and AND gate 57 is enabled to permit data to flow in the control loop 45 from the $C_2$ bit position of the upper-shift register 49 to the $C'_2$ bit position of the lower-shift register 51. Within switch 41, AND gate 93 is enabled and AND gate 97 is inhibited to provide a clock signal to the control loop of s bits per second.

Thus, in the idle mode of operation the binary "one" index bit and the binary zeroes stored within the control loop or CCD circular shift register 45 are continuously shifted around the register ring formed by the upper-shift register 49 and the lower-shift register 51, for maintaining the signal charge level of the data therein. The data contained in the cells or circular shift registers 11 of the stack memory system are also being circulated or shifted through all bit positions of the cells 11 at a clock rate of s bits per second, during the idle operation.

The WRITE mode of operation for the system control circuit will now be given in detail. The WRITE mode is initiated when the WRITE signal line goes high setting flip-flop 81, causing AND gate 53 of the control loop 45 to be disabled, in order to open the signal path between $C_1$ bit position of the lower register 51 of the control loop 45 and the $C_1$ bit position of the upper register 49 of the control loop 45. When the ONE bit of control loop 45 is shifted into the $C_1$ bit position of the lower register 51, the ONE bit is outputted through AND gate 61 to set flip-flop 73. The setting of flip-flop 73 causes AND gate 79 to be enabled, wherein the PUSH signal line goes high and the PUSH signal line goes low, causing flip-flop 81 to be reset and AND gate 91 of switch 41 to be disabled. Since the POP signal line is low in the WRITE Mode of operation, AND gate 97 of switch 41 is disabled; therefore, AND gates 93 and 97 of switch 41 are now both disabled, thereby preventing the clock signal from being outputted from switch 41 to the control loop 45. The setting of flip-flop 73 also causes flip-flop 77 to be set, in order to store the ONE bit of the control loop 45 for reentry into the control loop 45 at the end of one clock period.

At the end of one clock period, AND gate 61 is disabled causing flip-flops 73 and 77 to be reset, and AND gate 79 to be disabled. The disabling of AND gate 79 causes the PUSH signal line to go low, and the PUSH signal line to go high, thereby resetting flip-flop 81 and enabling AND gate 91 causing switch 41 to output a clock signal of s bits per second to the control loop. At substantially the same time, the ONE bit of the control loop 45 is clocked back into the control loop 45 from flip-flop 77 through OR gate 55 into the $C_1$ bit position of the upper register 49. The system control circuit is now in the idle mode of operation, and will remain in the idle mode until it receives a WRITE or READ input signal.

Operation of the system control circuit for a READ Operation is initiated by inputtting a READ signal into AND gate 89 of logic 43. The READ signal or pulse sets flip-flop 87, causing the $Q_r$ output of flip-flop 87 to go high. Accordingly, the $Q_r$ output of flip-flop 87 of logic 43 goes low, causing AND gate 57 of control loop to be disabled to open the signal path between the $C_2$ bit position of upper register 49 and the $C_2$ bit position of lower register 51 of control loop 45. When the ONE bit of control loop 45 is shifted into the $C_2$ bit position of upper register 49 of the control loop 45, the ONE bit is sensed through AND gate 63 of the control loop to set flip-flop 65 of logic 43.

The setting of flip-flop 65 causes the POP signal line to go high and the POP signal line to go low. As a result, AND gate 91 of switch 41 is disabled, and AND gate 97 of switch 41 is enabled, thereby causing switch 41 to output a clock signal of 2s bits per second for one normal clock period (1/s seconds). At the end of one normal clock period, READ flip-flop 87 of logic 43 and flip-flop 65 of logic 43 are reset, causing switch 41 to delete the 2s bit per second clock signal to control loop 45 and now output a clock signal of s bits per second to control loop 45. The system control is now in the idle mode of operation.

When the system control circuit is initially turned on, a ONE bit must be entered into the control loop 45. The ONE bit is entered into the control loop 45, after energizing the system control circuit, by feeding a positive going pulse from the E line through OR gate 55 of control loop 45 into the $C'_1$ bit position of the upper shift register 49 of control loop 45. The ONE bit is clocked into the control loop 45 by the method of charge insertion that is well-known and described in the prior art previously noted in the "Background of the Invention."

As would be obvious to one skilled in the art, it should be noted that the stack memory organization is not limited to LIFO operation. First-in-first-out (FIFO) operation can be obtained by connecting appropriate logic between the $C_2$ output of the rightmost shift registers 11 and the output buffer 15. The additional logic may be operated in conjunction with the other system logic, to permit either a FIFO or LIFO mode of operation.

While a particular embodiment of the present invention has been described and illustrated, it will be apparent to those skilled in the art that changes and modifications may be made therein without departing from the spirit and scope of the invention as claimed.

What is claimed is:

1. A charge coupled device stack memory system providing last-in-first-out operation in response to read and write signals comprising:
   an input buffer means for storing data to be inputted to said stack;
   an output buffer means for storing data to be outputted from said stack;
   a plurality of rows each including a plurality of loops of charge coupled shift register cells;
   means for applying a two phase clock to circulate the data bits in said cells;
   first logic means for gating data from said input buffer means to the first loop in each said row and from each loop in a said row to the next successive loop in that row in response to a first control signal, for gating data to the said output buffer means from each said first loop and from each loop in a said row to the next preceding loop in that row in response to a second control signal and for gating data around said loop in response to third and fourth control signals;
   control means for maintaining an indication of the position of the data bits in said shift register cells; and
   second logic means responsive to a said read signal, a said write signal and said indication of said control means to produce said first, second, third and fourth control signals.

2. The CCD stack memory system of claim 7, wherein each of said loops has a data feed input, a data feed output, a data return input and a data return output and the data feed input of the leftmost register of each one of the said rows of two-phase CCD shift registers in connected to an individual output of said input buffer register; the data feed output of each register being connected to the data feed input of the adjacent register to the right for transmitting data bits between said registers, proceeding from left to right in any one row of said registers; the data return output of each register being connected to the data return input of the adjacent register to the left for transmitting data bits between said registers, proceeding from right to left in any one row of said registers; and the data return output of the leftmost register of each one of said rows of registers being connected to an individual input of said output buffer.

3. The CCD stack memory system of claim 2, wherein each loop of two-phase CCD circular shift register cells further includes:
   upper and lower two-phase CCD shift registers each having an input and an output; and wherein said first logic means comprises:

means controlled by said second logic means in a write mode of operation for interconnecting said data feed input to the input of said registers, for enabling said data feed output connected to the output of said lower register and for interconnecting the output of said upper register to the input of said lower register;

and being controlled by said second logic means in a read mode of operation for interconnecting the output of said lower register to the input of said upper register, for enabling said data return output connected to the output of said upper register, and for interconnecting said data return input to the input of said lower register;

and being controlled by said second logic means in an idle mode of operation for interconnecting the output of said lower register to the input of said upper register, for interconnecting the output of said upper register to the input of said lower register, and for disabling said data feed input, data feed output, data return input, and data return output.

4. The CCD stack memory system of claim 3 wherein said means controlled by said second logic means includes:
   an upper OR gate;
   an upper AND gate enabled for interconnecting the output of said lower register through said OR gate to the input of said upper register, said AND gate adapted to be disabled for enabling said data feed output of said lower register;
   a write AND gate enabled for interconnecting said data feed input through said OR gate to the input of said upper register;
   a lower OR gate;
   a lower AND gate enabled for interconnecting the output of said upper register through said lower OR gate to the input of said lower register, said lower AND gate adapted to be disabled for enabling said data return output of said upper register; and
   a read AND gate enabled for interconnecting said data return input through said lower OR gate to the input of said lower register.

5. The CCD stack memory system of claim 1 wherein said control means includes:
   a circular shift register serving as a control loop having a binary "one" bit stored therein in bit synchronization with the last bit of data written into any one of the leftmost registers of the rows of said two-phase CCD circular shift registers, all other bit positions of said control loop being binary zeros.

6. The CCD stack memory of claim 5 wherein said second logic means includes:
   control logic means responsive to said read and write input signals, and to the shifting of said binary "one" bit of said control loop into a first bit position of the control loop during a read operation, and into a second bit position of the control loop during a write operation, for supplying control signals to said first logic means;
   a clock generator providing a first clock signal of s bits per second, and a second clock signal of 2s bits per second, said first clock signal being connected to each one of said plurality of loops of charge coupled shift register cells; and
   switching means operated by said control logic means for interconnecting said first clock signal to said control loop during an idle mode of operation of said memory system, for disconnecting said first clock signal from said control loop for 1/s seconds, when during a write mode of operation the "one" bit of said control loop is shifted into said first bit position of said control loop, for disconnecting said first clock signal and connecting said second clock signal to said control loop for 1/s seconds, when during a read mode of operation the one bit of said control loop is shifted into said second bit position of said control loop.

7. The CCD stack memory system of claim 6, wherein said circular control shift register of said control means further includes:
   a lower CCD control shift register having said first bit position;
   an upper CCD control shift register having said second bit position; and
   control loop logic means for interconnecting said upper and lower CCD control shift registers into a circular control shift register configuration having bit storage positions equal in number to the bit storage positions of each one of said plurality of loops of charge coupled shift register cells, and for controlling the initial and re-entry inputting of said binary one bit into said upper control shift register.

8. The CCD stack memory system of claim 7, wherein said control loop logic means of said circular control shift register includes:
   a first sensing AND gate having an individual input connected to said first bit position of said lower CCD control shift register, said sensing AND gate being enabled to sense the entry of said one bit into said first bit position of said lower CCD control register;
   an upper control OR gate having an output connected to an input of said upper CCD control register, and an individual input connected to an entry signal line for initially entering said one bit into said circular control shift register; an upper control AND gate being enabled for interconnecting said first bit position of said lower control register to an individual input of said upper CCD control OR gate;
   a second sensing AND gate having an individual input connected to said second bit position of said upper CCD control shift register, said second sensing AND gate being enabled to sense the entry of said one bit into said second bit position of said upper CCD control register;
   a lower control OR gate having an output connected to an input of said lower control register, and an individual input connected to an output of said second sensing AND gate; and
   a lower control AND gate being enabled for interconnecting said second bit position of said upper CCD control register to an individual input of said lower control OR gate.

9. The CCD stack memory system of claim 8, wherein said control logic means of said control means further includes:
   a write flip-flop set by said write input signal, for enabling said first sensing AND gate of said circular control shift register, for disabling said upper control AND gate of said circular control shift register, and for operating said switching means to remove said first clock signal from said circular control shift register;
   a read flip-flop set by said read input signal, for enabling said second sensing AND gate of said circular control shift register, and for disabling said lower control AND gate of said circular control shift register;

a first sensing flip-flop set by said first sensing AND gate of said circular control shift register;

a storage flip-flop set by and upon the setting of said first sensing flip-flop, said storage flip-flop adapted to be set to store said binary "one" bit of said circular control shift register for re-entry through said upper control OR gate of said circular control register into said upper control register of said circular control register upon the completion of a write operation;

a push AND gate enabled by setting of both said first sensing flip-flop and said write flip-flop for outputting a PUSH control signal for enabling said write AND gate of each one of said plurality of CCD circular shift registers, and for resetting said write flip-flop of said control logic means;

a first inverter having an input connected to an output of said PUSH AND gate, the output of said inverter being a PUSH signal for enabling said upper AND gate of each one of said plurality of two-phase CCD circular shift registers;

a first input AND gate enabled by said PUSH output signal of said first inverter for interconnecting said write signal to the set input of said write flip-flop;

a second sensing flip-flop set by said second sensing AND gate of said circular control register;

a pop AND gate enabled by the setting of both said second sensing flip-flop and said read flip-flop for outputting a POP control signal for resetting said read flip-flop, and for enabling said read AND gate of each one of said plurality of CCD circular shift registers;

a second inverter having an input connected to an output of said inverter being a POP signal for enabling said lower AND gate of each one of said plurality of CCD circular shift registers; and a second input AND gate enabled by said POP output signal of said second inverter for interconnecting said read signal to the set input of said read flip-flop.

10. The CCD stack memory system of claim 9, wherein said switching means further includes:

a first switching AND gate enabled both by said PUSH output signal of said first inverter, and said POP output signal of said second inverter;

a transfer OR gate;

a second switching AND gate enabled by the resetting of both of said write and said read flip-flops, and by the enabling of said first switching AND gate, for interconnecting said first clock signal of said clock generator through said transfer OR gate to said circular shift register; and a third switching AND gate enabled by the POP output signal of said pop AND gate, and the setting of said flip-flop, for interconnecting said second clock through said transfer OR gate to said circular control shift register.

* * * * *

UNITED STATES PATENT OFFICE
CERTIFICATE OF CORRECTION

PATENT NO. : 3,942,163
DATED : March 2, 1976
INVENTOR(S) : Deepak K. Goyal

It is certified that error appears in the above-identified patent and that said Letters Patent are hereby corrected as shown below:

Col. 2, line 3, "circuits" should be --circuit--

Col. 9, line 10, "Mode" should be --mode--

Col. 9, line 34, "inputtting" should be --inputting--

Col. 9, line 34, "Operation" should be --operation--

Claim 2, line 45, "claim 7" should be --claim 1--

Claim 2, line 50, "in" should be --is--

Claim 8, line 38, "an upper control, etc." should be properly paragraphed.

Signed and Sealed this

Twenty-fourth Day of August 1976

[SEAL]

Attest:

RUTH C. MASON
Attesting Officer

C. MARSHALL DANN
Commissioner of Patents and Trademarks